United States Patent
Ichimura

(10) Patent No.: US 9,871,469 B2
(45) Date of Patent: Jan. 16, 2018

(54) PIEZOELECTRIC VIBRATOR ELEMENT, AND PIEZOELECTRIC VIBRATOR

(71) Applicant: SII Crystal Technology Inc., Chiba-shi, Chiba (JP)

(72) Inventor: Naoya Ichimura, Chiba (JP)

(73) Assignee: SII CRYSTAL TECHNOLOGY INC., Chiba (JP)

( * ) Notice: Subject to any disclaimer, the term of this patent is extended or adjusted under 35 U.S.C. 154(b) by 0 days.

(21) Appl. No.: 15/431,209

(22) Filed: Feb. 13, 2017

(65) Prior Publication Data
US 2017/0244339 A1    Aug. 24, 2017

(30) Foreign Application Priority Data
Feb. 23, 2016 (JP) .................... 2016-031987

(51) Int. Cl.
| | |
|---|---|
| H03H 9/21 | (2006.01) |
| H02N 2/00 | (2006.01) |
| B06B 1/06 | (2006.01) |
| H01L 41/09 | (2006.01) |
| H01L 41/187 | (2006.01) |

(52) U.S. Cl.
CPC ......... *H02N 2/0015* (2013.01); *B06B 1/0603* (2013.01); *H01L 41/0933* (2013.01); *H01L 41/187* (2013.01)

(58) Field of Classification Search
CPC ............ H03H 9/21; H03H 9/215; H03H 3/04; H03H 9/2468; H03H 9/2473; H03H 9/2484; H03H 9/2494; H03H 2003/026; H03H 2003/0492; B06B 1/0659; G01C 19/5607
See application file for complete search history.

(56) References Cited

U.S. PATENT DOCUMENTS

| | | | |
|---|---|---|---|
| 2005/0116586 A1* | 6/2005 | Tanaya .................... | H03H 9/21 310/348 |
| 2010/0096954 A1* | 4/2010 | Kawanishi ........... | H03H 9/1014 310/370 |
| 2011/0140794 A1* | 6/2011 | Fukuda .................... | H03H 3/02 331/158 |
| 2011/0227672 A1* | 9/2011 | Yamada ............... | H03H 9/0547 333/200 |
| 2012/0248938 A1* | 10/2012 | Kawanishi .......... | H03H 9/0595 310/344 |

FOREIGN PATENT DOCUMENTS

| | | |
|---|---|---|
| JP | 2005-081501 A | 3/2005 |
| JP | 2006-270177 A | 10/2006 |

* cited by examiner

*Primary Examiner* — J. San Martin
(74) *Attorney, Agent, or Firm* — Brinks Gilson & Lione

(57) ABSTRACT

A piezoelectric vibrator element includes a pair of vibrating arms extending from a base, and having a groove on each of opposing principal surfaces in the longitudinal direction of the vibrating arms. Two systems of excitation electrodes are included on the side surfaces and the opposing principal surfaces, and in the grooves of the vibrating arms. A width of a bank part formed by a side surface of the vibrating arms and a side surface of the groves is W0, and the separation distance between the excitation electrodes on the opposing principal surfaces is W1, such that 1 μm<W1<3 μm and W0>W1.

8 Claims, 6 Drawing Sheets

PIEZOELECTRIC VIBRATOR ELEMENT, AND PIEZOELECTRIC VIBRATOR

RELATED APPLICATIONS

This application claims priority under 35 U.S.C. §119 to Japanese Patent Application No. 2016-031987 filed on Feb. 23, 2016, the entire content of which is hereby incorporated by reference.

BACKGROUND OF THE INVENTION

1. Technical Field

The present invention relates to a piezoelectric vibrator element and a piezoelectric vibrator, and in detail to an excitation electrode for exciting a vibrating arm part.

2. Related Art

For example, in the electronic apparatus such as a cellular phone or a portable information terminal, there is used a piezoelectric vibrator using a quartz crystal or the like as a device used for a clock time source, a timing source for a control signal and so on, a reference signal source, and so on.

As a piezoelectric vibrator of this kind, there has been known a device having a piezoelectric vibrator element hermetically encapsulated in a cavity formed of a package and a lid member as shown in JP-A-2005-81501.

FIGS. 6A and 6B show the structure of a typical piezoelectric vibrator element 600 of related art, wherein FIG. 6A shows a perspective view, and FIG. 6B shows a perspective view viewed from the P-P cross-section.

As shown in FIGS. 6A and 6B, the piezoelectric vibrator element 600 is provided with a base part 800 formed of a piezoelectric material and having a predetermined length, and a pair of vibrating arms 700a, 700b extending side by side from the base part 800.

Both of the vibrating arms 700a, 700b are respectively provided with groove parts 720a, 720b formed on the principal surfaces (the obverse and reverse surfaces) so as to extend in the longitudinal direction of the vibrating arms, and at the same time, provided with two systems of electrodes 910, 920 formed on the principal surfaces and the side surfaces thereof and supplied with driving voltages.

Regarding formation of the electrodes 910, 920, the electrode material is deposited on the entire area of the piezoelectric vibrator element 600 including the inside of the groove parts 720a, 720b using an evaporation process or a sputtering process. Then, by removing the parts where the hatching does not exist in FIG. 6 using a photolithography process, the electrode 910 and the electrode 920 are separated from each other.

In the piezoelectric vibrator element 600 formed in such a manner as described above, by applying voltages different in system respectively to the electrode 910 and the electrode 920, both of the vibrating arms 700a, 700b vibrate relatively to each other.

Incidentally, the piezoelectric vibrator element 600 is miniaturized due to a requirement from an electronic apparatus in which the piezoelectric element 600 is mounted. Due to the miniaturization of the piezoelectric vibrator element 600, the width W0 in each of the vibrating arms 700a, 700b has also been narrowing.

Meanwhile, the distance W5 between the electrode 910 and the electrode 920 has previously remained in a range of 6 through 7 μm.

Therefore, there is a problem that the width w of each of the electrodes 910, 920 formed on the principal surfaces (the reverse and obverse surfaces) of each of the vibrating arms 700a, 700b narrows, and as a result, the area of the electrode part making a contribution to the vibration (where the piezoelectric effect is excited) decreases.

It should be noted that although it is also possible to narrow the width of each of the groove parts 720a, 720b as much as the decrease in the width W0 in each of the vibrating arms 700a, 700b, it is not preferable for the vibrating arms 700a, 700b with the width W0 equal to or smaller than 10 μm to narrow the groove part width since the CI value increases.

SUMMARY OF THE INVENTION

The invention has an object of ensuring the larger area of the electrode part making a contribution to the vibration in the case of the miniaturization of the piezoelectric vibrator element.

(1) According to a first aspect of the invention, there is provided a piezoelectric vibrator element including a base, a pair of vibrating arm parts extending side by side from the base, a first excitation electrode disposed on an outer peripheral surface of each of the vibrating arm parts, and a second excitation electrode disposed on the outer peripheral surface of each of the vibrating arm parts, wherein an electrode separation width W1 between the first excitation electrode and the second excitation electrode formed on both principal surfaces opposed to each other of each of the vibrating arm parts fulfills 1 μm<W1<3 μm.

(2) According to a second aspect of the invention, in the piezoelectric vibrator element according to the first aspect of the invention, the both principal surfaces of each of the vibrating arm parts are respectively provided with groove parts formed along a longitudinal direction of the vibrating arm parts, and in a case of defining a width of a bank part formed of a side surface of each of the vibrating arm parts and an inner side surface of each of the groove parts as W0, the electrode separation width W1 between the first excitation electrode and the second excitation electrode formed on each of the principal surfaces in the bank part fulfills W1<W0.

(3) According to a third aspect of the invention, in the piezoelectric vibrator element according to the second aspect of the invention, the bank part is funned to have the width W0 of about 3 μm.

(4) According to a fourth aspect of the invention, in the piezoelectric vibrator element according to any one of the first, second, and third aspects of the invention, the first excitation electrode and the second excitation electrode formed on each of the principal surfaces in at least the bank part are covered with an insulating film.

(5) According to a fifth aspect of the invention, in the piezoelectric vibrator element according to any one of the first, second, third, and fourth aspects of the invention, each of the vibrating arm parts is formed so that both side surfaces of the vibrating arm part tilt to gradually increase a width of the principal surface of the vibrating arm part from a midpoint on a tip side of the vibrating arm part toward the base side.

(6) According to a sixth aspect of the invention, in the piezoelectric vibrator element according to the fifth aspect of the invention, among the both side surfaces thus tilted, an inner side surface opposed to the other vibrating arm part gradually increases in width to the base, and among the both side surfaces thus tilted, an outer side surface located on an outer side gradually increases in width to a midpoint on a path reaching the base, and is formed to have a same plane as a side surface of the base from the midpoint to the base.

(7) According to a seventh aspect of the invention, in the piezoelectric vibrator element according to any one of the first through sixth aspects of the invention, a pair of support arm parts used for mounting, extending from the base, and arranged side by side on the outer side of the vibrating arm part.

(8) According to an eighth aspect of the invention, there is provided a piezoelectric vibrator including a package provided with a mounting part, and the piezoelectric vibrator element according to any one of the first through seventh aspects of the invention, and mounted on the mounting part via a bonding material.

According to the invention, since the electrode separation width W1 between the first excitation electrode and the second excitation electrode formed on the both principal surfaces opposed to each other of the vibrating arm part fulfills 1 μm<W1<3 μm, a larger area of the electrode part making a contribution on the vibration can be ensured.

BRIEF DESCRIPTION OF THE DRAWINGS

FIGS. 4A through 4C are explanatory diagrams regarding the distance between excitation electrodes provided to vibrating arms.

DESCRIPTION OF AN EXEMPLARY EMBODIMENT

Figure 1:
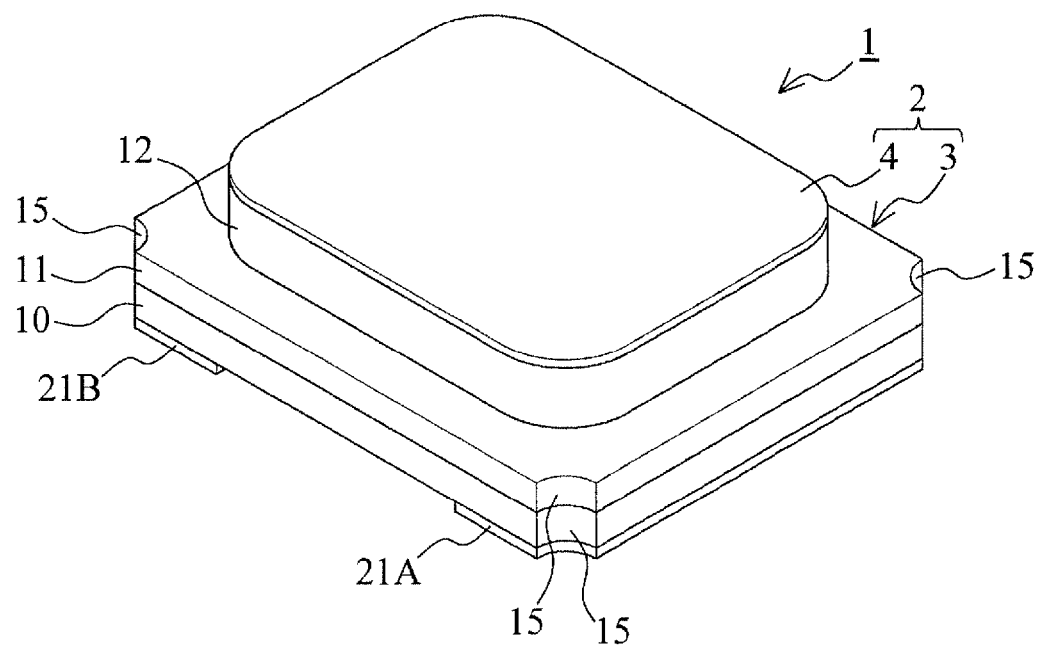
FIG. 1 is an exterior perspective view of a piezoelectric vibrator.

Hereinafter, a preferred embodiment in a piezoelectric vibrator element and a piezoelectric vibrator according to the invention will be described in detail with reference to FIG. 1 through FIG. 5.

(1) Outline of Embodiment

The piezoelectric vibrator element 6 according to the present embodiment is a piezoelectric vibrator element shaped like a tuning fork provided with a pair of vibrating arm parts 7 extending from a base 8, and support arm parts 9 extending from the base 8 on both outer sides of the vibrating arm parts 7 in parallel to the vibrating arm parts 7. In the longitudinal direction of the pair of vibrating arm parts 7, groove parts 72 each having a constant width are formed on the principal surfaces (the reverse and obverse surfaces) of each of the vibrating arm parts 7.

On the side surfaces and principal surfaces constituting the outer peripheral surfaces of the vibrating arm parts 7, and the inside of the groove parts 72, there are formed excitation electrodes 91, 92 of two systems different from each other functioning as a first excitation electrode and a second excitation electrode.

In the case of defining a width of a bank part formed by a side surface of each of the vibrating arm parts 7 and a side surface of the groove part 72 as W0, and the distance between the excitation electrodes 91, 92 formed on the principal surface of each of the vibrating arm parts 7 as an electrode separation width W1, in the present embodiment, the electrode separation width W1 is formed in a range of 1 μm<W1<3 μm so as to fulfill W0>W1.

As described above, by making the electrode separation width W1 narrower than 3 μm, it is possible to increase the width of each of the excitation electrodes 91, 92 formed on the principal surface (on the bank part) of each of the vibrating arm parts 7. Thus, the area of the electrode part making a contribution to the vibration can be increased, and the piezoelectric effect can be improved.

It should be noted that although in the present embodiment, the support. arm parts 9 are bonded to the mounting part of the package housing the piezoelectric vibrator element 6, the invention can be applied to a piezoelectric vibrator having the base 8 bonded to the mounting part without forming the support arm parts, or a piezoelectric vibrator element having a shape provided with a single support arm part extending from the base 8 and formed between the both vibrating arm parts 7, the single support arm being engaged with the mounting part.

Further, although in the present embodiment, the groove parts 72 are formed on the principal surfaces (the reverse and obverse surfaces) of each of the vibrating arm parts 7, the invention can also be applied to a tuning-fork piezoelectric vibrator element of the related art with no groove part provided to the vibrating arm part.

(2) Details of Embodiment

First Embodiment

Figure 2:
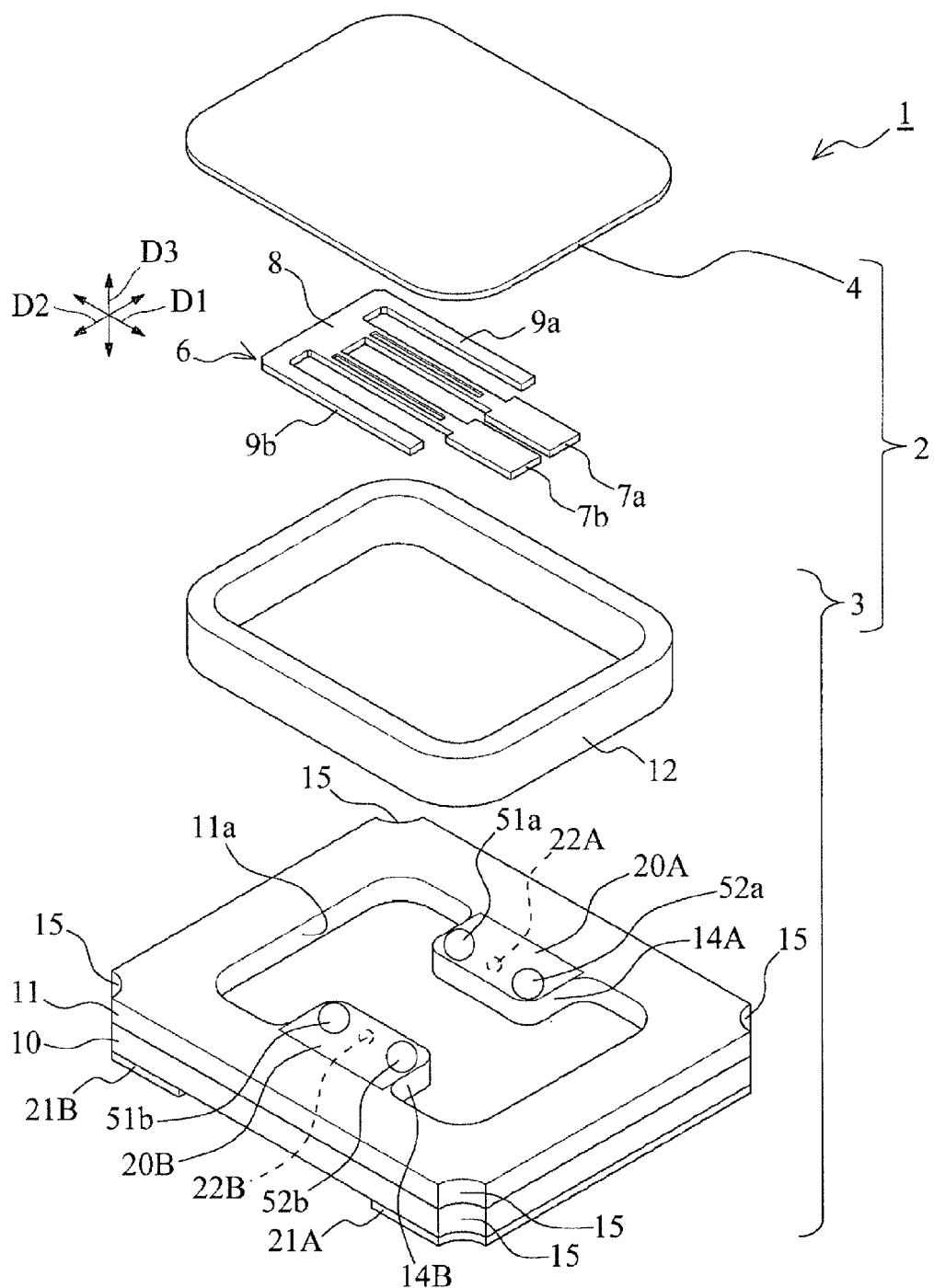
FIG. 2 is an exploded perspective view of the piezoelectric vibrator.

FIG. 1 is an exterior perspective view of the piezoelectric vibrator equipped with the piezoelectric vibrator element according to the first embodiment. FIG. 2 is an exploded perspective view of the piezoelectric vibrator according to the first embodiment.

As shown in FIGS. 1 and 2, the piezoelectric vibrator 1 according to the present embodiment is formed as a surface-mounted vibrator of a ceramic package type provided with a package 2 incorporating a cavity C airtightly sealed, and a piezoelectric vibrator element 6 housed in the cavity C.

It should be noted that since the piezoelectric vibrator 1 according to the present embodiment has a bilaterally symmetrical structure, in the description, the both parts symmetrically disposed will be denoted by the same numeric characters, and in order to distinguish the both parts from each other, discriminators a, A are attached to one of the parts and discriminators b, B are attached to the other of the parts in such a manner as the vibrating arm part 7a and the vibrating arm part 7b. It should be noted that in the description, the discriminators are arbitrarily omitted, and in such a case, each of the parts is denoted.

The piezoelectric vibrator element 6 is a so-called tuning-fork vibrator element formed of a piezoelectric material such as quartz crystal, lithium tantalate, or lithium niobate, and vibrates when a predetermined voltage is applied. In the present embodiment, the description will be presented citing the piezoelectric vibrator element, which is formed using the quartz crystal as the piezoelectric material, as an example.

The piezoelectric vibrator element 6 is provided with the vibrating arm parts 7a, 7b extending in parallel to each other from the base 8, and the support arm parts 9a, 9b extending from the base 8 on the outer sides of the vibrating arm parts 7a, 7b in the same direction, and is held in the cavity C by the support arm parts 9a, 9b. The details of the piezoelectric vibrator element 6 will be described later.

The package 2 is formed to have a roughly rectangular solid shape. The package 2 is provided with a package main body 3, and a sealing plate 4, which is bonded to the package main body 3 to form the cavity C between the sealing plate 4 and the package main body 3.

The package main body 3 is provided with a first base substrate 10 and a second base substrate 11 bonded to each other in the state of being overlapped with each other, and a sealing ring 12 bonded on the second base substrate 11.

On the four corners of each of the first base substrates 10 and the second base substrate 11, cutout parts 15 each having a quarter-arc shape in a planar view are respectively formed throughout the entire substrate in the thickness direction of the both base substrates 10, 11. The first base substrate 10 and the second base substrate 11 are manufactured by bonding two ceramic substrates in, for example, a wafer state so as to overlap each other, then forming a plurality of through holes, which penetrate both of the ceramic substrates and are arranged in a matrix, and subsequently cutting both of the ceramic substrates in a grid manner with reference to the through holes. On this occasion, the cutout parts 15 are formed by dividing the through hole into four parts.

It should be noted that although it is assumed that the first base substrate 10 and the second base substrate 11 are made of ceramic, as the specific ceramic material, there can be cited, for example, HTCC (High Temperature Co-Fired Ceramic) made of alumina, and LTCC (Low Temperature Co-Fired Ceramic) made of glass ceramic.

The upper surface of the first base substrate 10 corresponds to a bottom surface of the cavity C.

The second base substrate 11 is overlapped with the first base substrate 10, and is bonded to the first base substrate 10 by sintering or the like. In other words, the second base substrate 11 is integrated with the first base substrate 10.

It should be noted that as described later, between the first base substrate 10 and the second base substrate 11, there are formed connection electrodes 24A, 24B (not shown) in the state of being sandwiched by the both base substrates 10, 11.

The second base substrate 11 is provided with a penetrating part 11a. The penetrating part 11a is formed to have a rectangular planar shape with the four corners rounded. The inner side surface of the penetrating part 11a forms a part of the sidewall of the cavity C. The inner side surfaces on both sides opposed to each other in a direction of the shorter side of the penetrating part 11a, there are respectively disposed mounting parts 14A, 14B protruding inward. The mounting parts 14A, 14B are formed at roughly the center in the longitudinal direction of the penetrating part 11a. The mounting parts 14A, 14B are formed to have a length equal to or longer than ⅓ of the length in the longitudinal direction of the penetrating part 11a.

The sealing ring 12 is an electrically-conductive frame-like member one size smaller than the outer shape of each of the first base substrate 10 and the second base substrate 11, and is bonded to the upper surface of the second base substrate 11. Specifically, the sealing ring 12 is bonded on the second base substrate 11 by baking with a brazing material such as silver solder, a soldering material, or the like, or bonded by fusion bonding to a metal bonding layer formed (by, e.g., evaporation or sputtering besides electrolytic plating or electroless plating) on the second base substrate 11.

As the material of the sealing ring 12, there can be cited, for example, a nickel base alloy, and specifically, it is sufficient to be selected from kovar, elinvar, invar, 42-alloy, and so on. In particular, as the material of the sealing ring 12, it is preferable to select a material closer in thermal expansion coefficient to the first base substrates 10 and the second base substrate 11 made of ceramic. For example, in the case of using alumina having the thermal expansion coefficient of $6.8 \times 10^{-6}/°$ C. as the first base substrate 10 and the second base substrate 11, kovar having the thermal expansion coefficient of $5.2 \times 10^{-6}/°$ C. or 42-alloy having the thermal expansion coefficient of 4.5 through $6.5 \times 10^{-6}/°$ C. is preferably used as the sealing ring 12.

The sealing plate 4 is an electrically-conductive substrate overlapped with the sealing ring 12, and is airtightly bonded to the package main body 3 by bonding to the sealing ring 12. Further, the space defined by the sealing plate 4, the sealing ring 12, the penetrating part 11a of the second base substrate 11, and the upper surface of the first base substrate 10 functions as the cavity C airtightly sealed.

As the welding method of the sealing plate 4, there can be cited, for example, seam welding by making a roller electrode have contact, laser welding, and ultrasonic welding. Further, in order to make the welding between the sealing plate 4 and the sealing ring 12 more reliable, it is preferable to form a bonding layer of nickel, gold, or the like having an affinity with each other at least on the lower surface of the sealing plate 4 and the upper surface of the sealing ring 12.

Incidentally, on the upper surfaces of the mounting parts 14A, 14B of the second base substrate 11, there are formed a pair of electrode pads 20A, 20B, respectively, which are connection electrodes with the piezoelectric vibrator element 6. Further, on the lower surface of the first base substrate 10, a pair of external electrodes 21A, 21B are formed in the longitudinal direction of the package 2 with a space. The electrode pads 20A, 20B and the external electrodes 21A, 21B are each a single layer film made of single metal or a laminated film having different metals stacked one another formed by, for example, vapor deposition or sputtering.

The electrode pads 20A, 20B and the external electrodes 21A, 21B are electrically connected to each other via second through electrodes 22A, 22B provided to the mounting parts 14A, 14B of the second base substrate 11, connection electrodes 24A, 24B (not shown) formed between the first base substrate 10 and the second base substrate 11, and first through electrodes 23A, 23B (not shown) provided to the first base substrate 10, respectively.

Meanwhile, although the details will be described later, on the electrode pads 20A, 20B, there are disposed first bonding members 51a, 51b and second bonding members 52a, 52b separated in a first direction D1 from each other, and the support arm parts 9a, 9b are each bonded at two points separated in the longitudinal direction from each other.

Figure 3A:
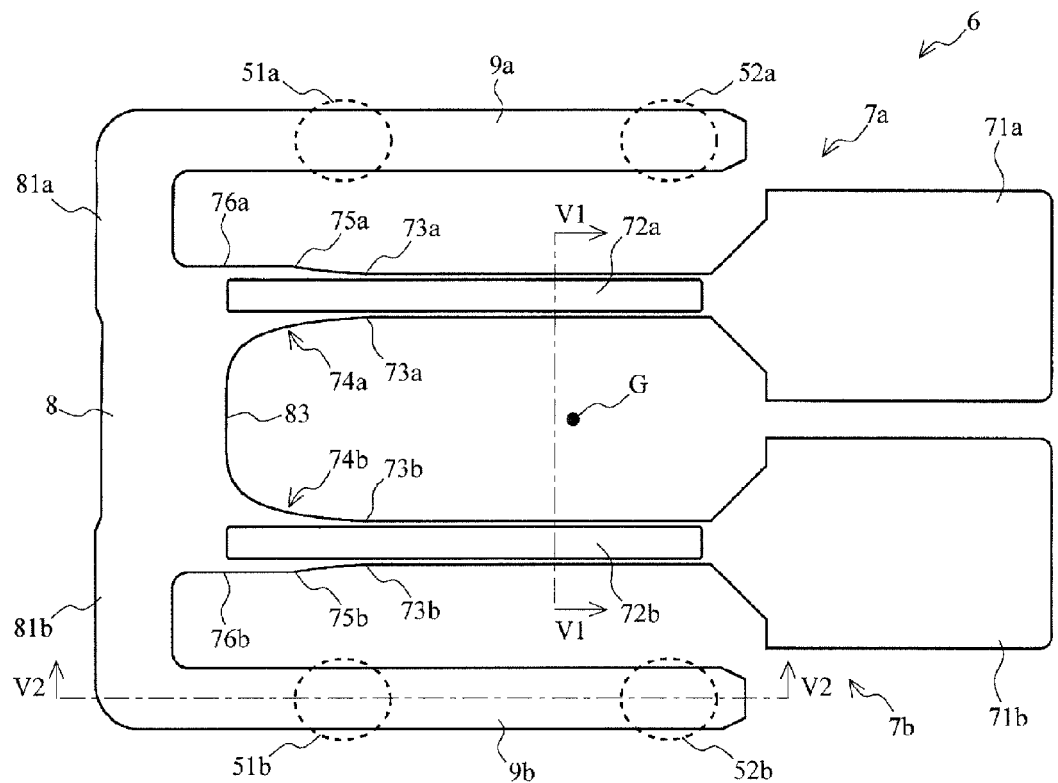
FIGS. 3A and 3B are diagrams respectively showing a configuration of a piezoelectric vibrator element and a cross-section of the piezoelectric vibrator.
Figure 3B:
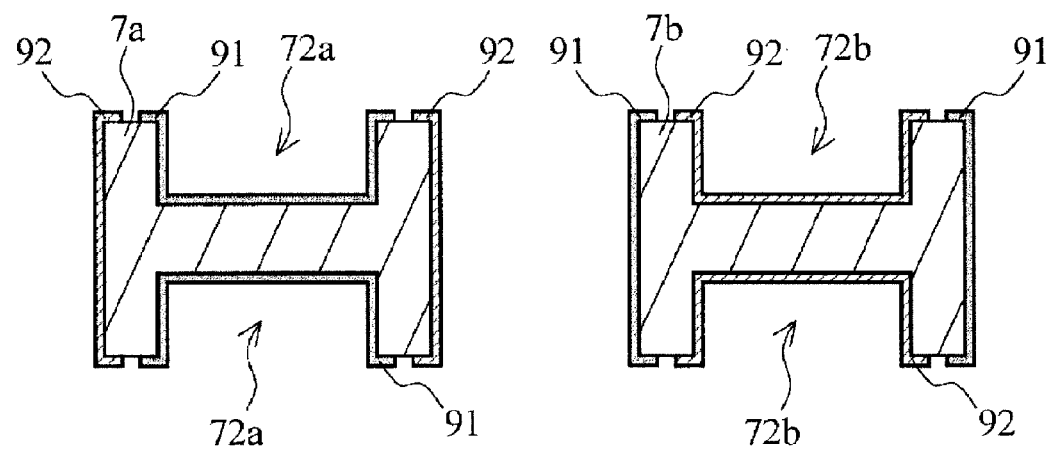

FIGS. 3A and 3B are diagrams showing a configuration of a piezoelectric vibrator element 6 according to the first embodiment, and a cross section of the piezoelectric vibrator.

Hereinafter, the explanation will be presented defining the longitudinal direction of the piezoelectric vibrator 1 on a plane parallel to the first base substrate 10 as a first direction D1, a direction (the shorter-side direction of the piezoelectric vibrator 1) perpendicular to the first direction D1 on the same plane as a second direction D2, and a direction (the thickness direction of the piezoelectric vibrator 1) perpendicular to the first direction D1 and the second direction D2 as a third direction D3 as shown in FIGS. 3A and 3B (see also FIG. 1).

As shown in FIG. 3A, the piezoelectric vibrator element 6 is provided with the pair of vibrating arm parts 7a, 7b, the base 8, and the pair of support arm parts 9a, 9b.

The base 8 connects one end parts in the first direction D1 of the pair of vibrating arm parts 7a, 7b to each other.

To the base 8, there are connected connection parts 81a, 81b extending outward along the second direction D2 from the both end surfaces facing to the second direction D2, and to the connection parts 81a, 81b, there are connected the support arm parts 9a, 9b each extending along the first direction D1. The pair of support arm parts 9a, 9b are disposed on the both outer sides of the vibrating arm parts 7a, 7b in the second direction D2.

In the support arm parts 9a, 9b, the length from the end part on the base 8 side to the tip part is equal to or longer than ⅔ of the total length a0 (described later) of the piezoelectric vibrator element 6. The length is for ensuring the distance between the first bonding members 51a, 51b and the second bonding members 52a, 52b as described later.

The pair of vibrating arm parts 7a, 7b are disposed so as to be parallel to each other, and each vibrate with the end part on the base 8 side acting as the fixed end and the tip acting as the free end.

In the case of defining the width of a roughly central part of the total length of each of the pair of vibrating arm parts 7a, 7b as the reference width, the pair of vibrating arm parts 7a, 7b are respectively provided with widened parts 71a, 71b each formed so as to extend on both sides to be wider than the reference width. The widened parts 71a, 71b have a function of increasing the weight and the inertia moment during the vibration of the vibrating arm parts 7a, 7b, respectively. Thus, the vibrating arm parts 7a, 7b become easy to vibrate, and the length of each of the vibrating arm parts 7a, 7b can be shortened to achieve miniaturization.

It should be noted that although in the piezoelectric vibrator element 6 according to the present embodiment, the widened parts 71a, 71b are respectively provided to the vibrating arm parts 7a, 7b, it is also possible to use the piezoelectric vibrator element without the widened parts.

Further, in the piezoelectric vibrator 1 according to the present embodiment, although not shown in the drawings, the tip parts (the widened parts 71a, 71b) of the vibrating arm parts 7a, 7b are each provided with a weight metal film (formed of a coarse adjustment film and a fine adjustment film) for performing an adjustment (a frequency adjustment) of the vibration state so as to vibrate within a predetermined frequency range. It is arranged that by irradiating the weight metal film with, for example, a laser beam to remove the weight metal film as much as is sufficient, it is possible to perform the frequency adjustment so that the frequency of the pair of vibrating arm parts 7a, 7b fit into the range of the nominal frequency of the device. It is also possible not to form the weight metal film similarly to the widened part.

On the base 8 side of the vibrating arm parts 7a, 7b, there are formed the widened parts 74a, 74b.

The inner sides (the sides opposed to each other) of the vibrating arm parts 7a, 7b in the widened parts 74a, 74b are formed continuously from widening start points 73a, 73b to an end part 83 on the tip side of the base 8 so as to widen gradually.

On the other hand, the outer sides of the vibrating arm parts 7a, 7b in the widened parts 74a, 74b are continuously formed from the widening start points 73a, 73b to midpoints 75a, 75b located closer to the widening start points 73a, 73b than the end part 83 so as to gradually widen similarly to (so as to be symmetrical with) the inner sides.

The outer side surfaces of the widened parts 74a, 74b are formed from the midpoints 75a, 75b to the base 8 so as to be parallel to the first direction D1 to form planes continuous with the end surfaces of the base 8.

Here, the length from the end part 83 of the base 8 to the widening start points 73a, 73b of the vibrating arm parts 7a, 7b are set to a length in a range from a length obtained by multiplying the length (the total length of the vibrating arm parts 7a, 7b) from the end part 83 to the tip by 0.25 to a length obtained by multiplying the total length of the vibrating arm parts 7a, 7b by 0.5.

By setting the length as described above, the CI value of not higher than 80 kΩ is realized, and the oscillation frequency of not higher than 40 kH is realized.

As described above, in the present embodiment, by forming the widened parts 74a, 74b on the base 8 side of the vibrating arm parts 7a, 7b, it is possible to increase the strength of the vibrating arm parts 7a, 7b.

Further, by stopping the widening of the outer side of the vibrating arm parts 7a, 7b at the midpoints 75a, 75b, it becomes possible to narrow the width of the base 8, and thus, the increase in strength and the miniaturization of the piezoelectric vibrator element 6 are realized.

Further, since the width from the inner wall surface of the groove parts 72a, 72b described later to the outer side surfaces of the vibrating arm parts 7a, 7b becomes narrower compared to the case of continuing the widening beyond the midpoints 75a, 75b, the electric field efficiency in the vicinity of the midpoints 75a, 75b is improved.

FIG. 3B is a cross-sectional view along the line V1-V1 shown in FIG. 3A viewed in the arrow direction.

As shown in FIGS. 3A and 3B, the pair of vibrating arm parts 7a, 7b are respectively provided with groove parts 72a, 72b each having a constant width throughout the entire length. The groove parts 72a, 72b are recessed in the third direction D3 on both principal surfaces (obverse and reverse surfaces) of the pair of vibrating arm parts 7a, 7b, and at the same time, extend along the first direction D1 from the base 8 side. The groove parts 72a, 72b are formed in an area extending from the base ends of the vibrating arm parts 7a, 7b (the end part 83 on the tip side of the base 8) to the front of the widened parts 71a, 71b, respectively.

Due to the groove parts 72a, 72b, the pair of vibrating arm parts 7a, 7b each has an H-shaped cross-sectional shape as shown in FIG. 3B.

As shown in FIG. 3B, on the outer surfaces (outer peripheral surfaces) of the pair of vibrating arm parts 7a, 7b, there are respectively formed a pair of (two systems of) excitation electrodes 91, 92 (the first excitation electrode, the second excitation electrode). Among these constituents, the excitation electrodes 91, 92 are electrodes for vibrating the pair of vibrating arm parts 7a, 7b in the direction of getting closer to or away from each other at a predetermined resonance frequency when a voltage is applied, and are formed on the vibrating arm parts 7a, 7b by patterning in an electrically separated state.

Specifically, one excitation electrode 91 is mainly formed in the groove parts 72a of one vibrating arm part 7a and on the side surfaces of the other vibrating arm part 7b in the state of being electrically connected to each other.

Further, the other excitation electrode 92 is mainly formed in the groove parts 72b of the other vibrating arm part 7b and on the side surfaces of the one vibrating arm part 7a in the state of being electrically connected to each other.

Although not shown in the drawings, on the surface of the piezoelectric vibrator element 6 opposed to the first base substrate 10, two systems of mounting electrodes are formed in the support arm parts 9a, 9b as mounting parts used when mounting the piezoelectric vibrator element 6 on the package 2, and two systems of wiring electrodes electrically connected to the respective mounting electrodes are provided to the connection parts 81a, 81b and the base 8.

Further, the mounting electrode of a first system provided to the support arm part 9a is connected to the excitation electrode 92 (see FIG. 3B) via the wiring electrode, and the mounting electrode of a second system provided to the support arm part 9b is connected to the excitation electrode 91 via the wiring electrode.

It is arranged that a voltage is applied to the two systems of excitation electrodes 91, 92 via a pair of mounting electrodes.

It should be noted that the excitation electrodes 91, 92, the mounting electrodes, and the wiring electrodes are each a laminated film of, for example, chromium (Cr) and gold (Au), and are each formed by depositing a chromium film having good adhesiveness with a quartz crystal as a foundation layer, and then providing a gold thin film on the surface of the chromium film. It should be noted that the case is not a limitation, and it is also possible to, for example, further stack a gold thin film on the surface of the laminated film formed of chromium and Nichrome (NiCr), or adopt a single layer film of chromium, nickel, aluminum (Al), titanium (Ti), or the like.

The excitation electrodes 91, 92, the mounting electrodes, and the wiring electrodes are formed in a similar manner to the related art. Specifically, an electrode material is deposited on the entire surface including the inside of the groove parts 720a, 720b of the piezoelectric vibrator element 6 not yet provided with the electrodes. The deposition is performed by vapor deposition or sputtering of the electrode material.

Then, by keeping the parts where the excitation electrodes 91, 92, the mounting electrodes, and the wiring electrodes are formed, and removing the other parts by photolithography, the two systems of electrode lines are formed.

Figure 4A:
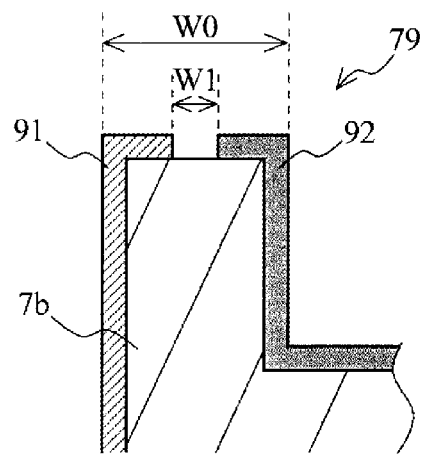
Figure 4A:
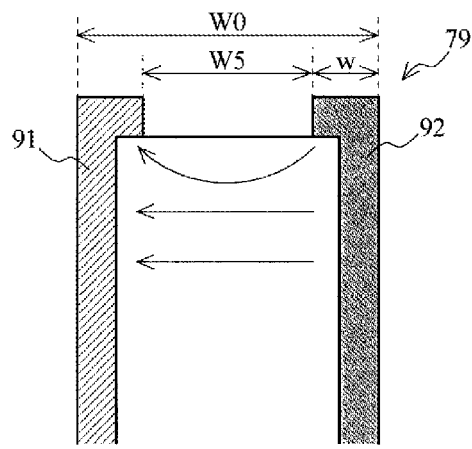
Figure 4C:
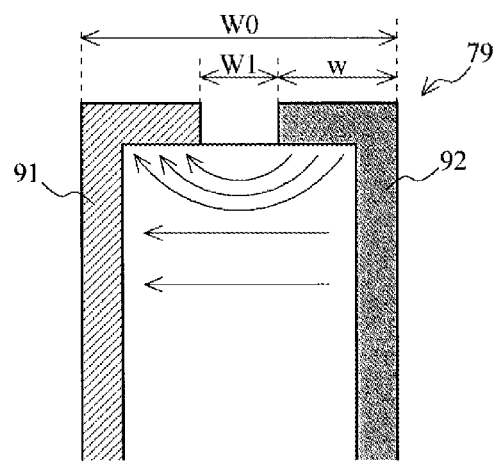

FIGS. 4A through 4C show the distance between the excitation electrodes 91, 92 formed on the principal surfaces (the obverse and the reverse surfaces) of the vibrating arm part 7.

Here, as shown in FIG. 4A, it is defined that the width (including the thickness of the excitation electrodes 91, 92 formed on the both side surfaces) of the bank part 79 formed of the side surface of the vibrating arm part 7 and the side surface of the groove part 72 is W0, and the distance between the excitation electrodes 91, 92 formed on the bank part 79 (on the principal surface of the vibrating arm part 7) is the electrode separation width W1.

In the piezoelectric vibrator element 6 according to the present embodiment, when removing the metal between the excitation electrodes 91, 92 to be formed on the bank part 79 using photolithography, the electrode separation width W1 is formed in the range of 1 μm<W1<3 μm so as to fulfill W0>W1.

FIGS. 4B and 4C show the electrical field states of the related art and the present embodiment generated between the both excitation electrodes 91, 92.

In the case of assuming the width W0 of the bank part 79 commonly as 10 μm, the electrode separation width W5 of the related art shown in FIG. 4B is in a range of 6 through 7 μm on the one hand, the electrode separation width W1 of the present embodiment shown in FIG. 4C is 3 μm on the other hand. Therefore, in the present embodiment, the width w of the excitation electrodes 91, 92 formed on the bank part 79 can be made larger than in the related art.

As a result, as indicated by the arrows in FIG. 4C, the density of the electrical field from one of the excitation electrodes 91, 92 toward the other on the bank part 79 can be increased, and thus the contribution to the vibration can be enhanced (the piezoelectric effect can be improved) as much as the increase in the width w of the excitation electrodes 91, 92.

The piezoelectric vibrator 1 according to the present embodiment is formed to have the size of, for example, 2.0 mm in length and 1.2 mm in width, 1.6 mm in length and 1.0 mm in width, or 1.2 mm in length and 1.0 mm in width, and is reduced in size compared to the related art piezoelectric vibrator.

Due to the miniaturization of the piezoelectric vibrator element 6, the bank part 79 is formed considerably narrower in width W0 to about 3 μm in the present embodiment than the width in the related art of about 10 μm.

Therefore, by making the electrode separation width W1 set in the range of 1 μm<W1<3 μm and fulfill W0>W1, even in the case of miniaturizing the piezoelectric vibrator element 6, the larger area of the excitation electrode formed on the bank part 79 can be ensured, and thus it is possible to further enhance the piezoelectric effect.

Figure 5:
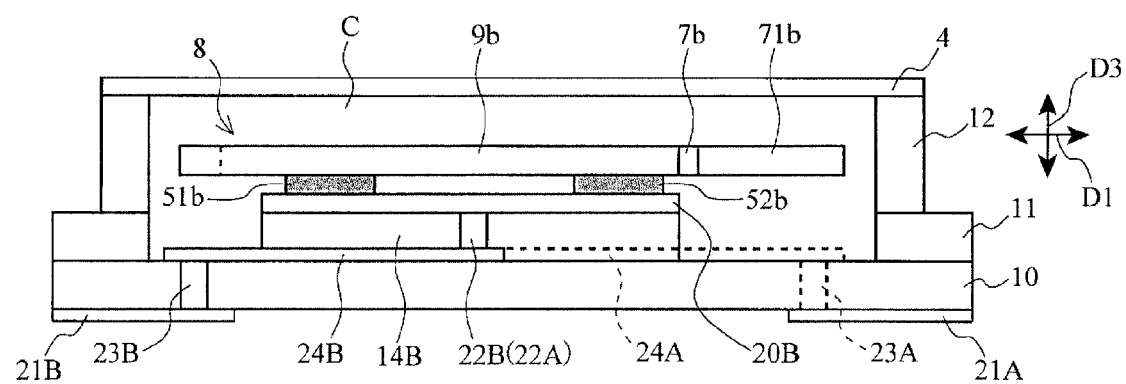
FIG. 5 is an explanatory diagram showing a side cross-sectional view of the piezoelectric vibrator element.
Figure 6A:
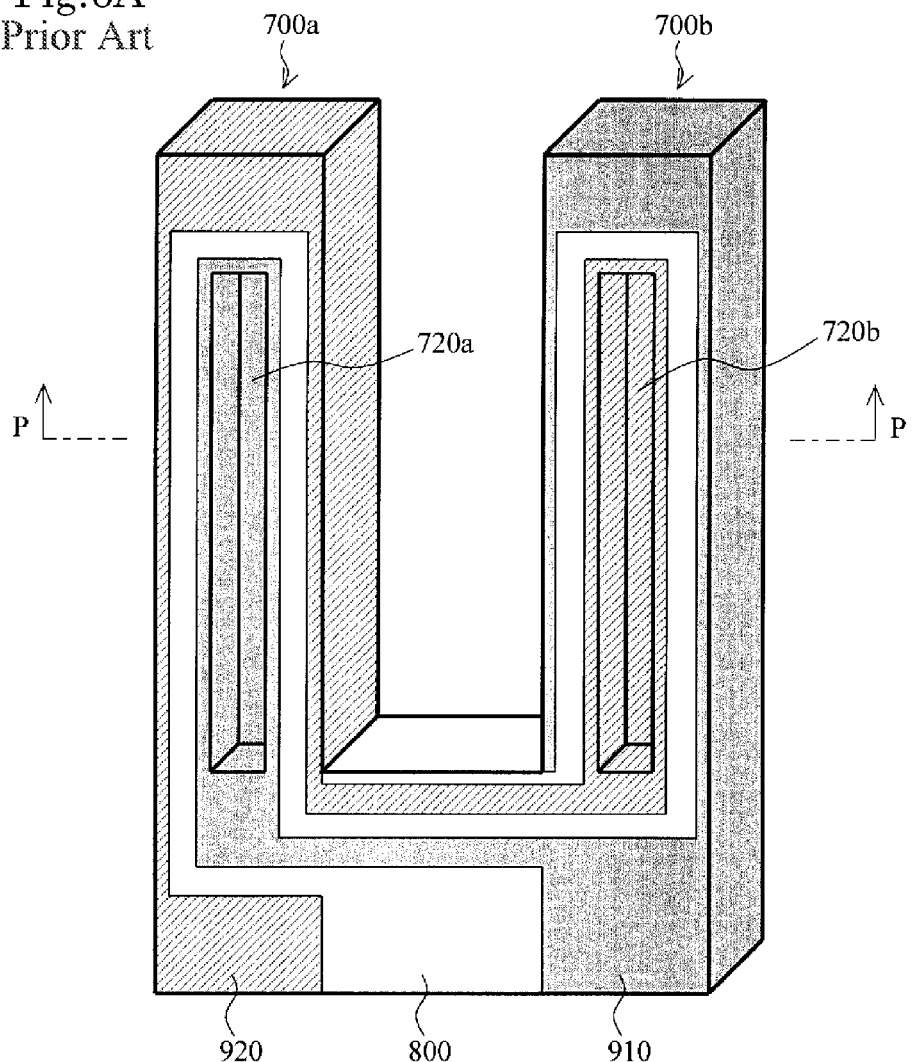
FIGS. 6A and 6B are explanatory diagrams showing a structure of a related-art piezoelectric vibrator element.
Figure 6B:
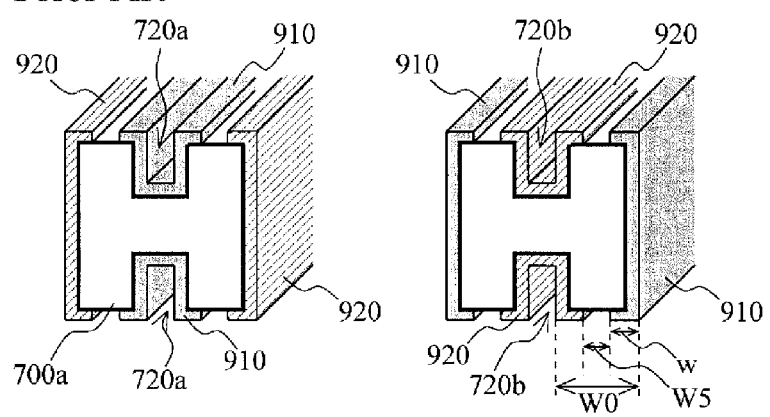

FIG. 5 is a cross-sectional view along the first direction D1 of the piezoelectric vibrator 1 having the piezoelectric vibrator element 6 mounted on the package 2 shown in FIG. 1, and is a cross-sectional view along the line V2-V2 shown in FIG. 3A viewed in the arrow direction. It should be noted that in order to show the second through electrode 23B, the cross-sectional position in that part is shifted.

On the mounting surfaces (the surfaces opposed to the sealing plate 4) of the mounting parts 14A, 14B of the second base substrate 11, there are formed the electrode pads 20A, 20B, respectively, throughout the roughly entire surfaces.

On the other hand, on the outer bottom surface of the first base substrate 10, the external electrodes 21A, 21B extending in the shorter-side direction (the second direction D2) are formed on the both end sides in the longitudinal direction (the first direction D1).

The electrode pads 20A, 20B and the external electrodes 21A, 21B are each a single layer film made of single metal or a laminated film having different metals stacked on one another formed by vapor deposition or sputtering, and the electrode pad 20A and the external electrode 21A are electrically connected to each other, and the electrode pad 20B and the external electrode 21B are electrically connected to each other.

Specifically, as shown in FIG. 5, the first base substrate 10 is provided with the first through electrode 23B electrically connected to the external electrode 21B, and penetrating the first base substrate 10 in the thickness direction. Further, at roughly the center of the mounting part 14B of the second base substrate 11 (see FIG. 2), there is formed the second through electrode 22B electrically connected to the electrode pad 20B, and penetrating the mounting part 14B in the thickness direction. Further, between the first base substrate 10 and the second base substrate 11 (the mounting part 14B), there is formed the connection electrode 24B for connecting the first through electrode 23B and the second through electrode 22B to each other.

As described above, the electrode pad 20B and the external electrode 21B are electrically connected to each other via the second through electrode 22B, the connection electrode 24B, and the first through electrode 23B.

On the other hand, as indicated by dotted lines in FIG. 5, the first base electrode 10 is provided with the first through electrode 23A electrically connected to the external electrode 21A, and penetrating the first base substrate 10 in the thickness direction, and at roughly the center of the mounting part 14A of the second base substrate 11 (see FIG. 2), there is formed the second through electrode 22A electrically connected to the electrode pad 20A, and penetrating the mounting part 14A in the thickness direction. Further, between the first base substrate 10 and the second base substrate 11 (the mounting part 14A), there is formed the connection electrode 24A for connecting the first through electrode 23A and the second through electrode 22A to each other.

As described above, the electrode pad 20A and the external electrode 21A are electrically connected to each other via the second through electrode 22A, the connection electrode 24A, and the first through electrode 23A.

It should be noted that the both connection electrodes 24A, 24B do not have shapes for linearly connecting the first through electrodes 23A, 23B and the second through electrodes 22A, 22B, respectively, to each other, but are formed along the area where the second base substrate 11 and the first base substrate 10 have contact with each other in order to avoid exposure in the cavity C.

The piezoelectric vibrator element 6 is housed in the cavity C of the package 2 airtightly sealed in the state of being mounted on the mounting parts 14A, 14B with the pair of support arm parts 9a, 9b.

Specifically, as shown in FIG. 3A and FIG. 5, in the piezoelectric vibrator element 6, the mounting electrodes provided to the support arm parts 9a, 9b are electrically and mechanically bonded to the electrode pads 20A, 20B (on metalization layers in the case in which the metalization layers are formed on the upper surfaces) on the mounting parts 14A, 14B via the first bonding members 51a, 51b and the second bonding members 52a, 52b.

As described above, in the piezoelectric vibrator element 6 according to the present embodiment, each of the support arm parts 9a, 9b is bonded and held on the corresponding one of the mounting parts 14A, 14B at the two regions arranged in the length direction (the first direction D1) (two-point mounting).

As the first bonding members 51a, 51b and the second bonding members 52a, 52b, a material having electrical conductivity, and having fluidity in the initial stage of the bonding process, and then solidified to develop the bonding strength in the later stage of the bonding process is used, and for example, an electrically-conductive adhesive such as a silver paste, and metal bumps are preferably used.

In the case in which the first bonding members 51a, 51b and the second bonding members 52a, 52b are each formed of an electrically-conductive adhesive, the electrically-conductive adhesive is applied by a dispenser nozzle supported by a moving head of a coating device.

In the present embodiment, although the size of each of the bonding members depends on the size of the piezoelectric vibrator 1, in the case of, for example, the piezoelectric vibrator 1 with a size of 1.2 mm×1.0 mm, the bonding member is applied so as to have a radius of about 0.1 mm.

Then, the arrangement relationship between the first bonding member 51 and the second bonding member 52 for bonding and holding the support arm part 9 on the mounting part 14 will be described.

It should be noted that in the following description, the centers of the first bonding member 51 and the second bonding member 52 for bonding the support arm part 9 are defined as bonding regions 51, 52, respectively.

As described above, the both support arm parts 9 are formed to be equal to or longer than ⅔ of the total length of the piezoelectric vibrator element 6, and are each connected at two or more places in the longitudinal direction, preferably two places, namely the bonding region 51 on the base 8 side and the bonding region 52 on the tip side.

Then, the second bonding member 52 is disposed in the tip part in the longitudinal direction of the support arm part 9. Meanwhile, the first bonding member 51 is disposed so that the bonding region 51 is located on the base 8 side of the centroid G of the piezoelectric vibrator element 6. Thus, it results that the centroid G exists between the both bonding regions 51, 52.

By disposing the bonding region 51, which is located on the base 8 side, on the base 8 side of the centroid G, as described above, the total length from the bonding region 51 to the tip of the vibrating arm part 7 passing through the base 8 can be shortened, and as a result, the displacement at the tip of the vibrating arm part 7 corresponding to an impact from the outside can be decreased.

On the other hand, in order to suppress the vibration leakage from the vibrating arm part 7, the bonding region 51 located on the base 8 side is disposed on the centroid G side of a connection part 81 between the base 8 and the support arm part 9.

Further, by providing two or more bonding regions, the junction strength (bonding strength) of the piezoelectric vibrator element 6 increases, and at the same time, the tilt occurring when mounting the piezoelectric vibrator element 6 on the electrically-conductive adhesive, which has not yet cured, can dramatically be reduced compared to the case in which a single bonding region is provided alone. Further, compared to the case of using the electrically-conductive adhesive on the entire support arm part 9, the amount of the adhesive used is reduced, and it becomes possible to further suppress generation of the gas in the cavity.

It should be noted that in order to improve the balance when mounting the piezoelectric vibrator element 6, and at the same time further reduce the generation of the gas, it is preferable to dispose the two bonging regions.

Further, the number of the bonding regions is not required to be two, but can also be one, or three or more. For example, at least one of the support arm parts 9 can also be connected at the bonding region on a line extending in the shorter-side direction and passing through the centroid G. Further, in the case in which the tip side part of the support arm part 9 is longer than the base side part of the support arm part 9 with respect to the centroid G, for example, the support arm part 9 can also be bonded at two or more bonding regions located on the tip side of the centroid G.

Further, in the present embodiment, the distance between the both bonding regions 51, 52 of the support arm part 9 is made longer. For example, the bonding regions 51, 52 are disposed in the vicinity of ⅓ of the total length of the piezoelectric vibrator element 6 from the base 8 side and the vicinity of ⅔ thereof, and the distance between the both bonding regions 51, 52 is set to about ⅓ of the total length thereof. Further, it is preferable to set the distance between the both bonding regions 51, 52 in a range of 45% through 35% of the total length of the piezoelectric vibrator element 6 to be slightly larger than ⅓ of the total length thereof.

In other words, in the case of defining the distance from the end part on the base 8 side of the piezoelectric vibrator element 6 to the bonding region 51 as a1, the distance between the bonding regions 51, 52 as a2, the distance from the bonding region 52 to the tip of the vibrating arm part 7 as a3, and the total length of the piezoelectric vibrator element 6 as a0 (=a1+a2+a3), it is preferable to set a2 in the range of 45% through 35% of a0. It is further preferable to fulfill a1<a3<a2.

By making the distance a2 between the both bonding regions 51, 52 longer (45% through 35%) than ⅓ of the total length a0 as described above, a part of the support arm part 9 located between the both bonding regions slightly bends to absorb or disperse the impact from the outside or the vibration of the vibrating arm part 7, and thus, it becomes possible to suppress the influence of the outside and the influence on the outside. Further, by fulfilling a1<a2, the total length from the bonding region 51 to the tip of the vibrating arm part 7 passing through the base 8 can be made shorter to thereby reduce the displacement of the tip with respect to the external force.

Here, the terms "vicinity" and "about" denote the range defined by the width z of the support arm part 9 which is the bonding object of the first bonding member 51 and the second bonding member 52.

Specifically, the "vicinity of ⅓" denotes the range of (⅓)−(z/2)≤(vicinity of ⅓)≤(⅓)+(z/2). Further, the "vicinity of ⅔" denotes the range of (⅔)−(z/2)≤(vicinity of ⅔)≤(⅔)+(z/2).

For example, it is sufficient for the bonding region 51 (the center of the first bonding member 51) to exist in a range of (⅓)−(z/2) through (⅓)+(z/2).

Therefore, about ⅓ of the total length, which is the "distance between the both bonding regions 51, 52," is in a range of (⅓)−z≤(about ⅓)≤(⅓)+z.

In the case of operating the piezoelectric vibrator 1 configured in such a manner, a predetermined voltage is applied to the external electrodes 21A, 21B. When the predetermined voltage is applied to the external electrodes 21A, 21B, a current flows through the two systems of excitation electrodes 91, 92, and the pair of vibrating arm parts 7a, 7b vibrate at a predetermined resonance frequency in a direction (the second direction D2) of, for example, getting closer to and away from each other due to the inverse piezoelectric effect caused by the electric field generated between the two systems of excitation electrodes 91, 92. The vibration of the pair of vibrating arm parts 7a, 7b is used as the time source, the timing source of a control signal, the reference signal source, and so on.

As described above, in the present embodiment, the area making a contribution to the vibration can be increased as much as the increase in width w of the excitation electrodes 91, 92 on the bank part 79 (the principal surface) located on the both sides of the groove part 72, and thus, the piezoelectric effect can be improved.

The piezoelectric vibrator 1 described hereinabove is used in a wave clock, a cellular phone, or a portable information terminal device as a timing source, a reference signal source, and so on of a clock source, a control signal, and so on, or used for a measurement device such as a gyro sensor, and so on.

The invention is not limited to the above embodiment described with reference to the drawings, but a variety of modified examples can be cited within the scope or the spirit of the invention.

For example, although in the embodiment described above, the surface mounted vibrator of the ceramic package type is described as the piezoelectric vibrator using the piezoelectric vibrator element, the piezoelectric vibrator element can also be applied to a piezoelectric vibrator of a glass package type having a base substrate and a lid substrate formed of a glass material bonded by anodic bonding.

Further, although the electrode pad 20 in the embodiment described above is formed on roughly the entire surface of the mounting part 14, it is sufficient for the electrode pad to be formed in a region corresponding to at least one of the first bonding member 51 and the second bonding member 52. In this case, the second through electrode 23 (see FIG. 5) is formed at a place of the mounting part 14 corresponding to the electrode pad 20.

Further, in the present embodiment, the excitation electrodes 91, 92 are formed on the bank part 79 so that the electrode separation width W1 between the excitation electrodes 91, 92 is extremely narrow. Therefore, it is also possible to arrange that at least the part of the excitation electrode 91, the electrode separation width W1, and the excitation electrode 92 formed on the principal surface in the bank part 79 is covered with an insulating film. It is preferable for the insulating film to be formed in the entire vibrating arm part 7.

As the insulating film, it is possible to use a variety of types of known insulating materials such as silicon oxide ($SiO_2$) film.

Due to the formation of the insulating film, it is possible to prevent the short circuit between the both excitation electrodes 91, 92 in the case of mounting the piezoelectric vibrator element 6.

What is claimed is:

1. A piezoelectric vibrator element comprising:
   a base;
   a pair of vibrating arms extending side by side from the base;
   a first excitation electrode on an outer peripheral surface of each of the vibrating arms; and
   a second excitation electrode on the outer peripheral surface of each of the vibrating arms,
   wherein an electrode separation width W1 between the first excitation electrode and the second excitation electrode on opposing principal surfaces of each of the vibrating arms is defined by 1 µm<W1<3 µm,
   wherein the opposing principal surfaces of each of the vibrating arms include grooves along a longitudinal direction of the vibrating arms, and
   wherein a width of a bank part W0 between a side surface of each of the vibrating arms and an inner side surface of each of the groves, including the first and second excitation electrodes, is less than 10 µm.

2. The piezoelectric vibrator element according to claim 1, wherein
   the electrode separation width W1 between the first excitation electrode and the second excitation electrode on the bank part is defined by W1<W0.

3. The piezoelectric vibrator element according to claim 2, wherein the width of the bank part W0 is about 3 µm.

4. The piezoelectric vibrator element according to claim 1, wherein the first excitation electrode and the second excitation electrode are covered with an insulating film.

5. The piezoelectric vibrator element according to claim 1, wherein each of the vibrating arm parts include side surfaces that tilt to gradually increase a width of the opposing principal surfaces of the vibrating arms from a midpoint on a tip side of the vibrating arms toward the base side.

6. The piezoelectric vibrator element according to claim 5, wherein among the tilted side surfaces, an inner side surface opposed to the other vibrating arm gradually increases in width to the base, and
   among the tilted side surfaces, an outer side surface located on an outer side gradually increases in width to a midpoint on a path reaching the base, and has a same plane as a side surface of the base from the midpoint to the base.

7. The piezoelectric vibrator element according to claim 1, further comprising a pair of support arms extending from the base side by side on the outer side of the vibrating arm part.

8. A piezoelectric vibrator comprising:
a package including a mounting part; and
the piezoelectric vibrator element according to claim 1 and mounted on the mounting part via a bonding material.

* * * * *